United States Patent [19]

Harada

[11] Patent Number: 4,945,537
[45] Date of Patent: Jul. 31, 1990

[54] MAXIMUM LENGTH LINEARLY OCCURRING CODE SEQUENCE GENERATOR

[75] Inventor: Masaaki Harada, Tokyo, Japan

[73] Assignee: Clarion Co., Ltd., Tokyo, Japan

[21] Appl. No.: 202,984

[22] Filed: Jun. 3, 1988

[30] Foreign Application Priority Data

Jun. 11, 1987 [JP] Japan .................................. 62-146527

[51] Int. Cl.$^5$ ............................................. G06F 11/10
[52] U.S. Cl. ..................................... 371/37.1; 364/717
[58] Field of Search ........................... 371/37, 30, 37.1; 364/717

[56] References Cited

U.S. PATENT DOCUMENTS

| | | | |
|---|---|---|---|
| 4,160,236 | 7/1979 | Oka et al. ............................. | 371/37.1 |
| 4,216,540 | 8/1980 | McSpadden ........................ | 371/37.1 |
| 4,845,654 | 7/1989 | Harada et al. ....................... | 364/717 |
| 4,912,666 | 3/1990 | Harada et al. ....................... | 364/717 |

OTHER PUBLICATIONS

Peterson & Weldon, Error Correcting Codes, 2nd Edition, The MIT Press, Cambridge, Mass., 1972, pp. 170-188.

Primary Examiner—Charles E. Atkinson
Attorney, Agent, or Firm—Flynn, Thiel, Boutell & Tanis

[57] ABSTRACT

A circuit includes a code sequence generator which generates a maximum length linearly occurring code sequence and which has a plurality of code data outputs coupled to respective inputs of a multiplexer, the multiplexer having an output which is coupled to an input of a three-state buffer. The output of the multiplexer and an output of the buffer are coupled to respective output terminals of the circuit. A control circuit supplies select signals to the multiplexer which cause the multiplexer to couple a selected one of its inputs to its output, and supplies to the buffer a control signal which selectively enables and disables the buffer.

9 Claims, 8 Drawing Sheets

| A0 | A1 | A2 | A3 | A4 | A5 | A6 | A7 | A8 | A9 | A10 | A11 | A12 | A13 | A14 | A15 |
|----|----|----|----|----|----|----|----|----|----|-----|-----|-----|-----|-----|-----|
| 0  | 0  | 0  | 0  | 0  | 0  | 0  | 0  | 0  | 0  | 0   | 0   | 0   | 0   | 0   | 0   |

| B0 | B1 | B2 | B3 | B4 | B5 | B6 | B7 | B8 | B9 | B10 | B11 | B12 | B13 | B14 | B15 |
|----|----|----|----|----|----|----|----|----|----|-----|-----|-----|-----|-----|-----|
| 1  | 0  | 0  | 0  | 0  | 0  | 0  | 0  | X  | X  | X   | X   | X   | X   | X   | X   |

| C0 | C1 | C2 | C3 |
|----|----|----|----|
| 1  | 1  | 1  | 0  |

FIG. 8A
PRIOR ART
| A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| B0 | B1 | B2 | B3 | B4 | B5 | B6 | B7 | B8 | B9 | B10 | B11 | B12 | B13 | B14 | B15 |
|---|---|---|---|---|---|---|---|---|---|---|---|---|---|---|---|
| 1 | 0 | 0 | 0 | 0 | 1 | 0 | 0 | 0 | 0 | 0 | 0 | 1 | 0 | 0 | 0 |
FIG. 8B
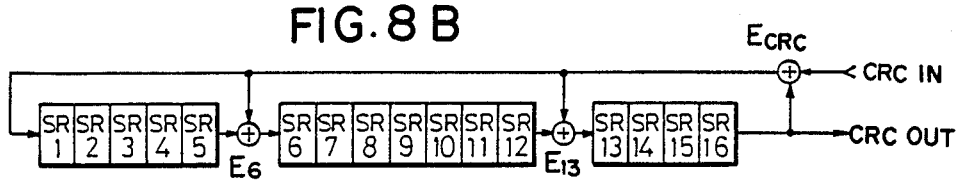
FIG. 9A
PRIOR ART
| A0 | A1 | A2 | A3 | A4 | A5 | A6 | A7 | A8 | A9 | A10 | A11 | A12 | A13 | A14 | A15 |
|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 |
| B0 | B1 | B2 | B3 | B4 | B5 | B6 | B7 | B8 | B9 | B10 | B11 | B12 | B13 | B14 | B15 |
|---|---|---|---|---|---|---|---|---|---|---|---|---|---|---|---|
| 1 | 0 | 1 | 0 | 0 | 0 | 0 | 0 | 0 | 0 | 0 | 0 | 0 | 0 | 0 | 1 |
FIG. 9B
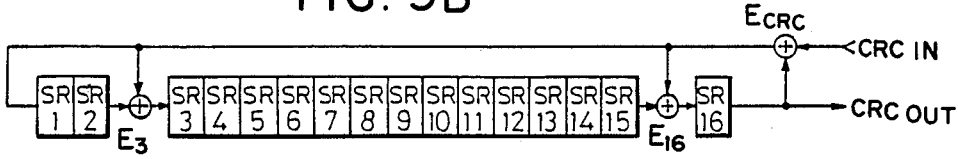

MAXIMUM LENGTH LINEARLY OCCURRING CODE SEQUENCE GENERATOR

FIELD OF THE INVENTION

This invention relates to a generator for generating maximum length linearly occurring code sequences (hereinafter called "M sequences") of digital data.

BACKGROUND OF THE INVENTION

As an M sequence generator capable of generating any desired M sequences under an external control against the period, pattern and phase of the M sequences and suitable for circuit integration, there is a circuit proposed in Japanese patent application No. 62-083033 filed Apr. 6, 1987 in the name of the assignee of the instant application. The circuit is shown in FIG. 6. The circuit has an additional advantage that a cascade connection enables an increase in the period of M sequences if necessary. In FIG. 6, $SR_1$ through $SR_n$ denote flip-flops of a shift register, $E_1$ through $E_n$ refer to exclusive logical sum (hereinafter called "EOR") gates, $G_1$ through $G_n$ designate steering gates for supplying the flip-flops with an initial value, MUX 1 denotes a multiplexer for generating a three-state output, $L_1$ through $L_5$ denote latch circuits, $AND_0$ through $AND_n$ refer to AND circuits, DE-MPX denotes a demultiplexer, and $INV_1$ and $INV_2$ denote inverters. $\overline{FBCNT}$ designates a signal for controlling enabled and disabled conditions of the three-state output, and $L_6$ is a latch circuit for synchronizing the control of conditions of the three-state output with a signal STB used for initializing generation of M sequences. Further, $\overline{CS}$ denotes a chip select signal, LE is a latch enable signal, $DAT_0$ through $DAT_{n-1}$ are data, $SEL_0$ and $SEL_1$ are data select signals, FBO is a feedback input terminal, FBI is an input terminal into the initial stage of the steering gates, and PN is a code output.

Such an M sequence generator can be used in a cyclic redundancy check (CRC) generator check circuit in the field of digital signal error detection technologies. When the M sequence generator of FIG. 6 is used, the CRC generator check circuit is capable of changing its generator polynomials. As a circuit arrangement of such an M sequence generator, there are two different types, i.e., a simple-type shift register arrangement and a modular-type shift register arrangement. The instant invention is directed to a modular-type shift register arrangement. FIG. 7 shows an arrangement of a CRC generator check circuit using the M sequence generator of FIG. 6. As shown in FIG. 7, by connecting an external circuit to the M sequence generator of FIG. 6 which circuit includes an exclusive logical sum gate $E_{CRC}$ and an AND gate $AND_{CRC}$, a known CRC generator check circuit is readily established.

Referring to FIG. 7, it is explained in detail how to arrange the CRC generator check circuit. Assume hereinbelow that the total number of steps n of the modular-type shift register ($SR_1$ through $SR_n$) is fixed to sixteen (16). In most cases, the total step number n of a modular-type shift register is fixed to 8, 16 or 32 for facilitating controls by a microcomputer, memory, etc.

In order to arrange a CRC generator check circuit, it is necessary to use in the exterior an exclusive logical sum gate $E_{CRC}$ for summing at mod. 2 the final stage output (CAS terminal) of a modular-type shift register with operated data of CRC (CRC IN) and use an AND gate $AND_{CRC}$ for controlling a feedback of the result of the operation of the exclusive logical sum gate $E_{CRC}$ to a feedback signal input (FBO terminal) of the M sequence generator. By obtaining an exclusive logical sum of the final stage output of the modular-type shift register and the operated data and by applying it to a predetermined stage of the modular-type shift register, a known division circuit, i.e. CRC generator check circuit, is established. Therefore, when logic "1" is entered in a control signal CRCCNT in FIG. 7, a division circuit is established. In this circuit, when the operated data is entered in the CRCIN terminal, a result of the division according to a generator polynomial is outputted from the CRCOUT terminal, and examination surpluses to be used for error detection remain in respective stages of the modular-type shift register. When the control signal CRCCNT is changed from logic "1" to logic "0", outputs of $AND_{CRC}$ and $AND_1$ through $AND_n$ exhibit logic "0", and the modular-type shift register performs a shift register operation to shift the data in the original form to the next stage in response to a clock signal. As a result, respective bits of examination surpluses are obtained serially from the CRCOUT terminal.

Such a generator polynomial is set by entering suitable data in the latch 4 from data lines $DAT_0$ through $DAT_{n-1}$. The latch 1 is supplied with logic "0" from all the data lines $DAT_0$ through $DAT_{n-1}$ so that all elements of the modular-type shift register exhibit logic "0" before starting CRC operation. The $\overline{FBCNT}$ signal is fixed to logic "0", the output of the multiplexer MUX 1 is set in a high impedance condition, and the FBO terminal serves as a terminal exclusive for entering a feedback signal. The data setting process is shown in Table 1. For example, in order to set generator polynomials $X^{16}+X^{12}+X^5+1$ and $X^{16}+X^{15}+X^2+1$, data are set as shown in FIGS. 8(a) and 9(a), respectively. In this case, the division circuit becomes equivalent to FIGS. 8(b) and 9(b), respectively.

Referring to a time chart of FIG. 10, it is explained in what timing respective signals are inputted and outputted when the M sequence generator of FIG. 7 is used in the CRC generator check circuit. Data for initializing the modular-type shift register and for setting generator polynomials are first entered in the latch 1 and the latch 2 at a time-division from the data lines $DAT_0$ through $DAT_{n-1}$. An address of the latches is instructed by $SEL_0$ through $SEL_1$, the latches are enabled by LE, and data are set in respective latches.

TABLE 1

| Data Selector | | Data | | | | | | | |
|---|---|---|---|---|---|---|---|---|---|
| SEL 0 | SEL 1 | DAT 0 | DAT 1 | DAT 2 | ... | DATm-1 | DATm | ... | DATn-2 | DATn-1 |
| 0 | 0 | $A_0$ | $A_1$ | $A_2$ | ... | $A_{m-1}$ | $A_m$ | ... | $A_{n-1}$ | $A_{n-1}$ |

$A_i$: initial value of the (i + 1)th step of the shift register. All are "0" in CRC operation.

TABLE 1-continued

| Data Selector | | Data | | | | | | | | |
|---|---|---|---|---|---|---|---|---|---|---|
| SEL 0 | SEL 1 | DAT 0 | DAT 1 | DAT 2 | ... | DATm-1 | DATm | ... | DATn-2 | DATn-1 | |
| 1 | 0 | $B_0$ | $B_1$ | $B_2$ | ... | $B_{m-1}$ | $B_m$ | ... | $B_{n-2}$ | $B_{n-1}$ | $B_1$: count of a generator polynomial $X^1$. The count of $X^n$ becomes "1" automatically. |

After the data are set, the STB signal triggers the circuit to start CRC operation. Firstly, all elements of the modular-type shift register are initialized to logic "0" by the data of the latch 1 and the latch 2, and geneation multinomials are established. Subsequently, operated data CRC1 is entered. During entering the operated data, the control signal CRCCNT is fixed to logic "1", the shift register performs a function of the division circuit. At this time, an operation result CRC2 is outputted to CRCOUT. When input of the operated data is completed, examination surpluses remain in respective stages of the modular-type shift register. Immediately, the control signal CRCCNT is fixed to logic "0", and subsequently, bit outputs CRC3 of the examination surpluses are outputted serially from CRCOUT.

As described, it is certainly possible to establish a CRC generator check circuit capable of changing generator polynomials, using the prior art M sequence generator. However, since the order number (multiplicity) of a generator polynomial is determined by the number of stages of the modular-type shift register, it is not possible to change the order numbers of the generator polynomials in the prior art M sequence generator in which the terminal for connection to the aforegoing EX is fixed to the final stage of the modular-type shift register.

OBJECT OF THE INVENTION

It is therefore an object of the invention to provide an M sequence generator capable of not only changing the order number of a generator polynomial but also setting any desired generator polynomial under a control from the exterior of the M sequence generator when used in a CRC generator check circuit.

SUMMARY OF THE INVENTION

In order to achieve the object, in an M sequence generator including a modular-type shift register consisting of a plurality of units in cascade connection which units each consists of an EOR gate, a flip-flop for temporarily holding an operation result of the EOR gate, an AND gate for supplying one of inputs of the EOR gate with an output to control its operation and a steering gate, the inventive M sequence generator is characterized in the use of a multiplexer for selecting one of outputs of the flip-flops in respective stages of the modular-type shift register and outputting it to the exterior, and a three-state buffer supplied with an output of the multiplexer to control a feedback of a signal from the multiplexer to respective EOR gates at respective steps of the modular-type shift register, so that an output of any desired stage of the modular-type shift register can be outputted to the exterior as a feedback signal.

BRIEF DESCRIPTION OF THE DRAWINGS

FIGS. 8A and 8B show how to establish a generator polynomial $X^{16}+X^{12}+X^5+1$;

FIGS. 9A and 9B show how to establish a generator polynomial $X^{16}+X^{15}+X^2+1$.

DETAILED DESCRIPTION

Figure 1:
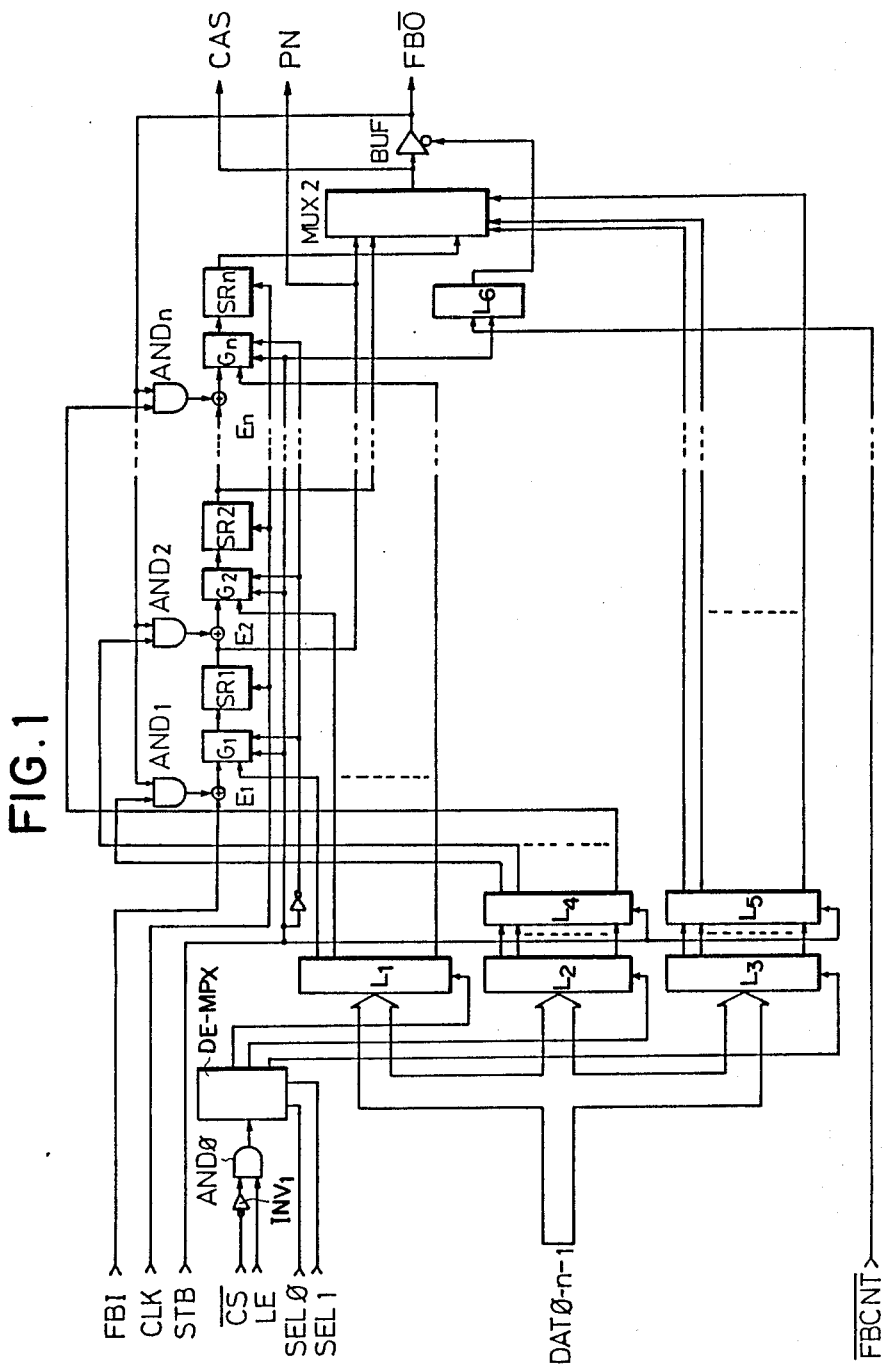
FIG. 1 is a block diagram of a general arrangement of an inventive M sequence generator.
Figure 6:
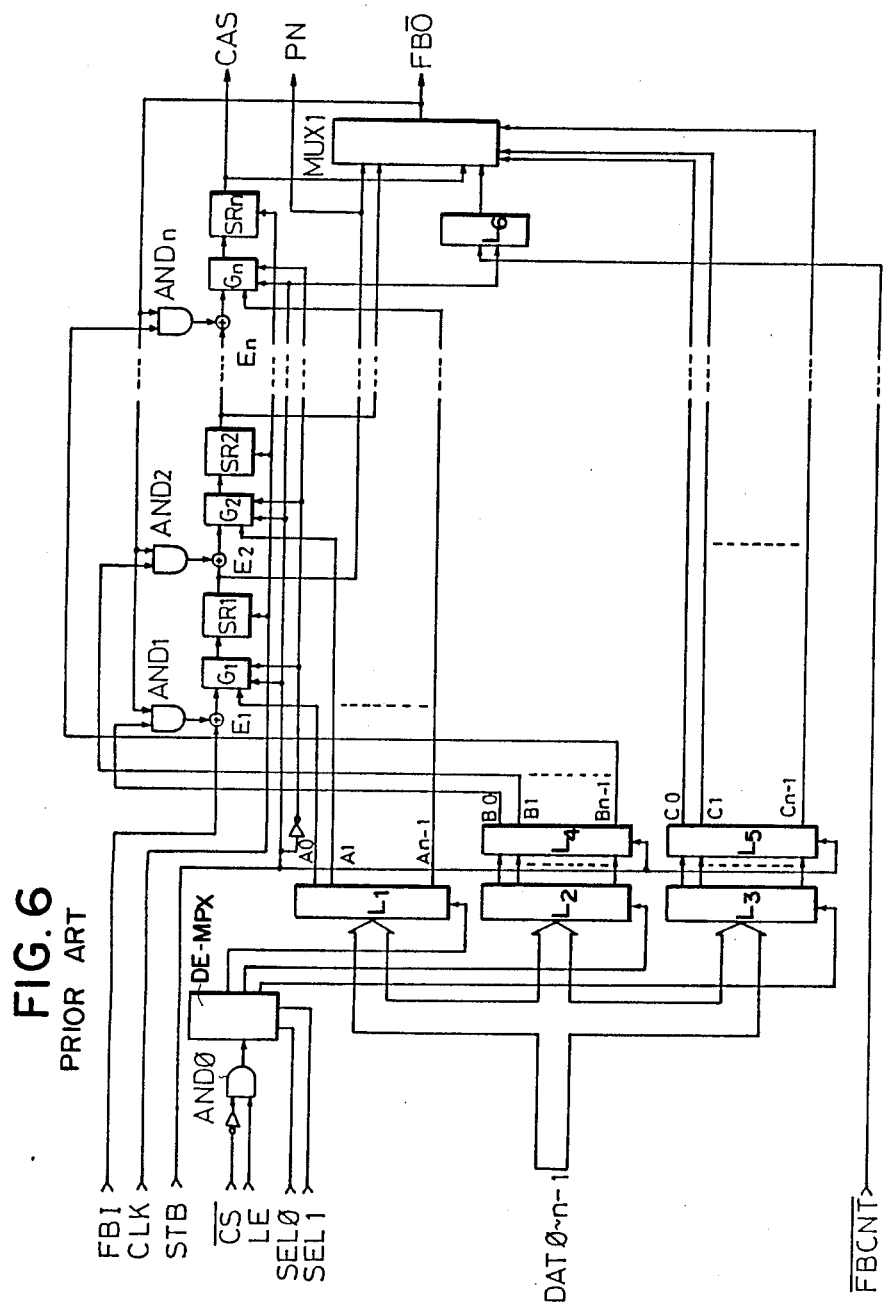
FIG. 6 is a block diagram of a prior art M sequence generator.

FIG. 1 is a block diagram showing an arrangement of an inventive M sequence generator. MUX 2 refers to a multiplexer configured to select one of outputs of respective stage $SR_1$ through $SR_n$ of the modular-type shift register and output it to the exterior and not configured to generate a three-state output unlike the multiplexer MUX 1 in the prior art system. BUF denotes a non-inverted buffer supplied with an output of a latch circuit 6 to change an output of MUX 2 into a three-state output to control a signal feedback from the multiplexer MUX 2 to respective EOR gates $E_1$ through $E_n$ of the shift register. A functional difference between M sequence generators of FIGS. 1 and 6 is that while the latter extracts the CAS output from the final stage output of the modular-type shift register, the former extracts it from the output of the multiplexer MUX 2. The former can select any desired stage of the modular-type shift register as an output. In the other respects, particularly regarding elements designated by the same reference numerals, both systems have identical functions.

Figure 2:
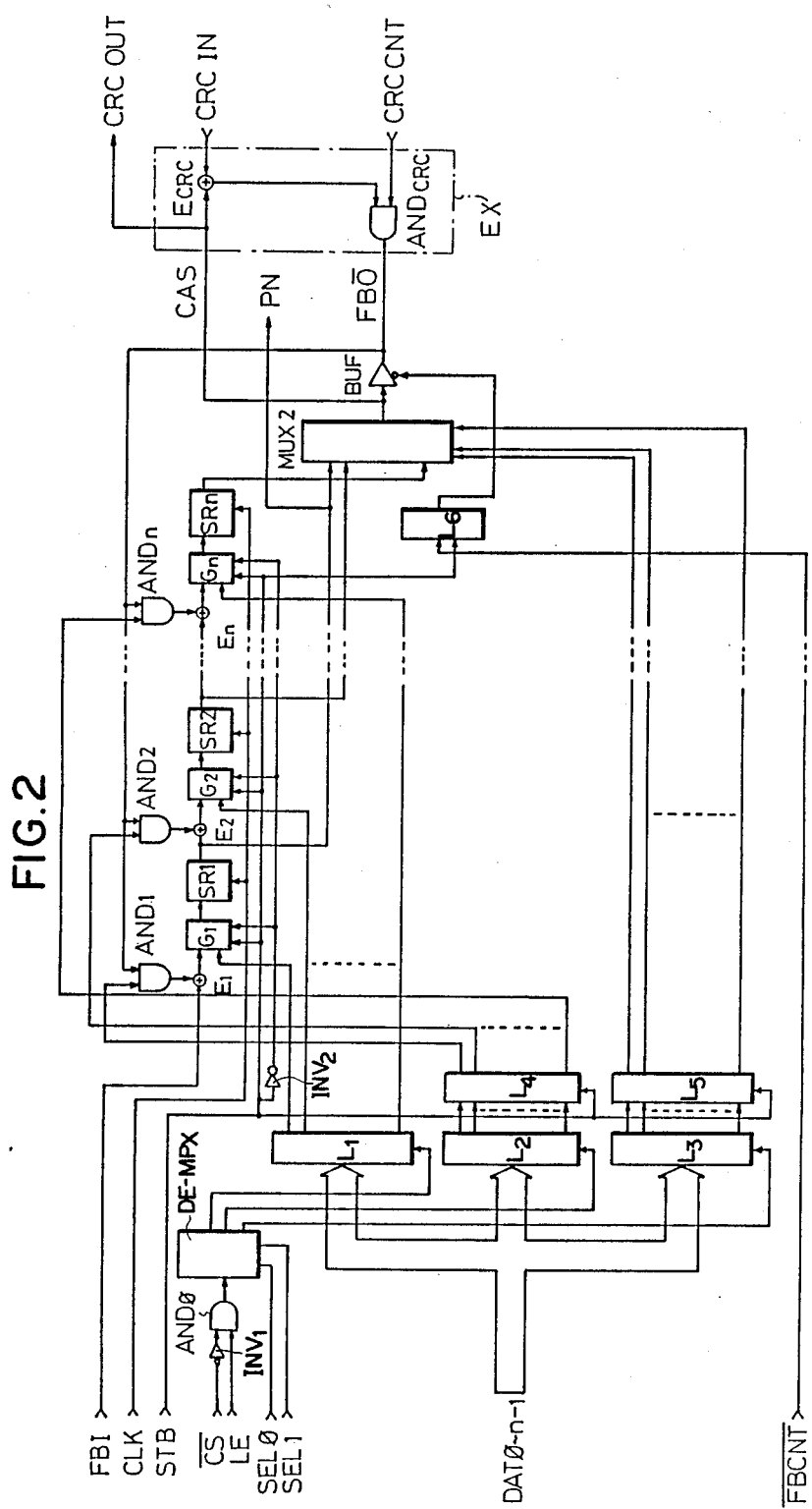
FIG. 2 is a block diagram of a general arrangement of a CRC generator check circuit using the inventive M sequence generator.
Figure 7:
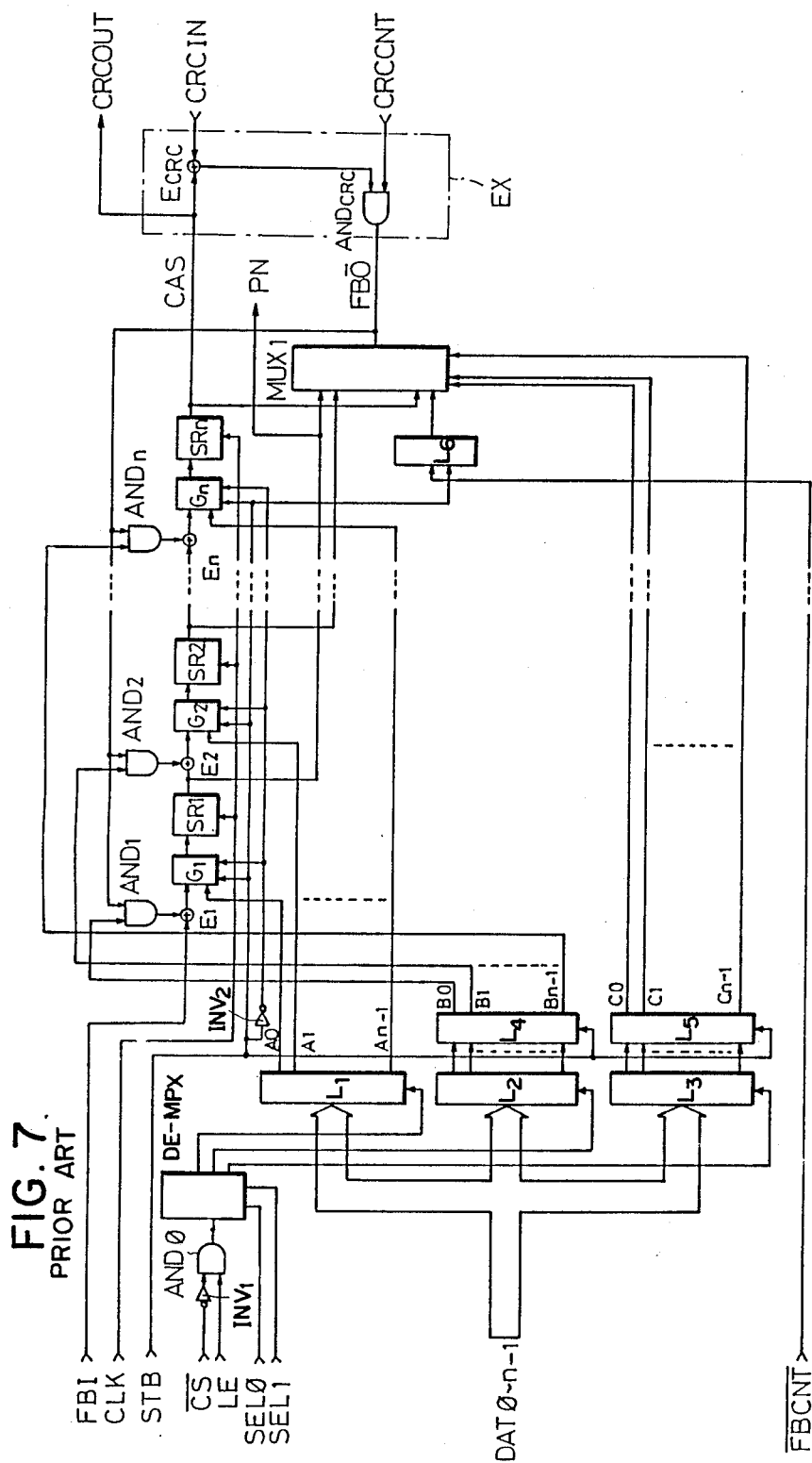
FIG. 7 is a block diagram of a CRC generator check circuit using the prior art M sequence generator.
Figure 10:
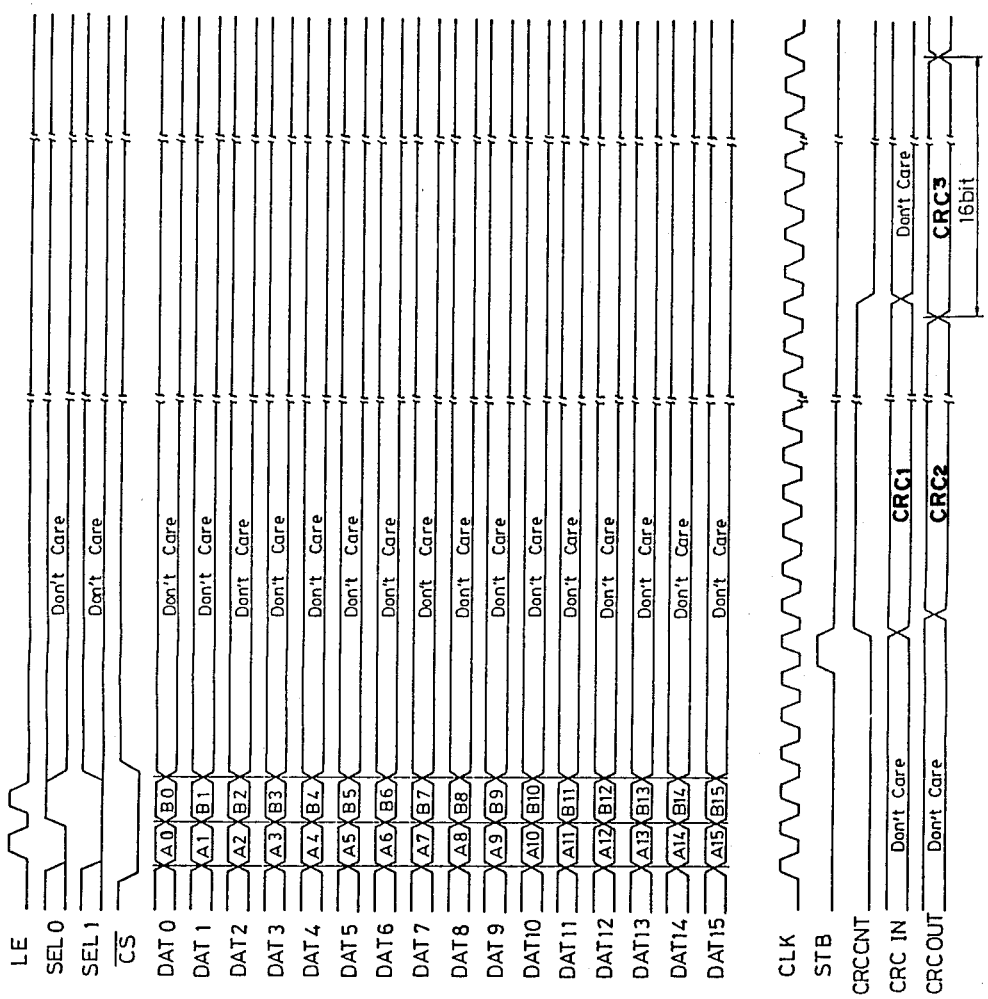
FIG. 10 is a time chart of a CRC operation by the prior art M sequence generator.

FIG. 2 shows an arrangement of a CRC generator check circuit using the inventive M sequence generator. Comparing it to the prior art arrangement of FIG. 7, there is no difference in the arrangement of the exterior circuit, connection of the generator to the exterior circuit and functions of the systems. In the prior art system, the CAS terminal output is fixed at the final stage of the modular-type shift register. In contrast, in the inventive system, the CAS terminal output can be extracted from any desired stage of the modular-type shift register under an address control of the multiplexer, and it is therefore possible to control the functional number of stages of the shift register of the CRC generator check circuit. Therefore, in the CRC generator check circuit using the inventive M sequence generator, it is possible to also control the order number (multiplicity) of a generator polynomial, and by establishing the CRC generator check circuit by connecting some M sequence generators of FIG. 1 in cascade, it is possible to establish a generator polynomial of any desired high multiplicity.

Figures 3A, 3B:
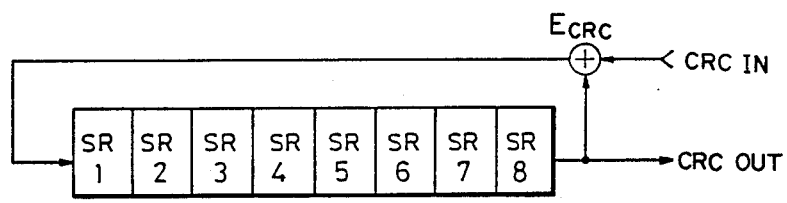
FIG. 3A shows data to establish a generator polynomial $X^8+1$.
FIG. 3B shows a circuit which implements such polynomial.
Figure 4:
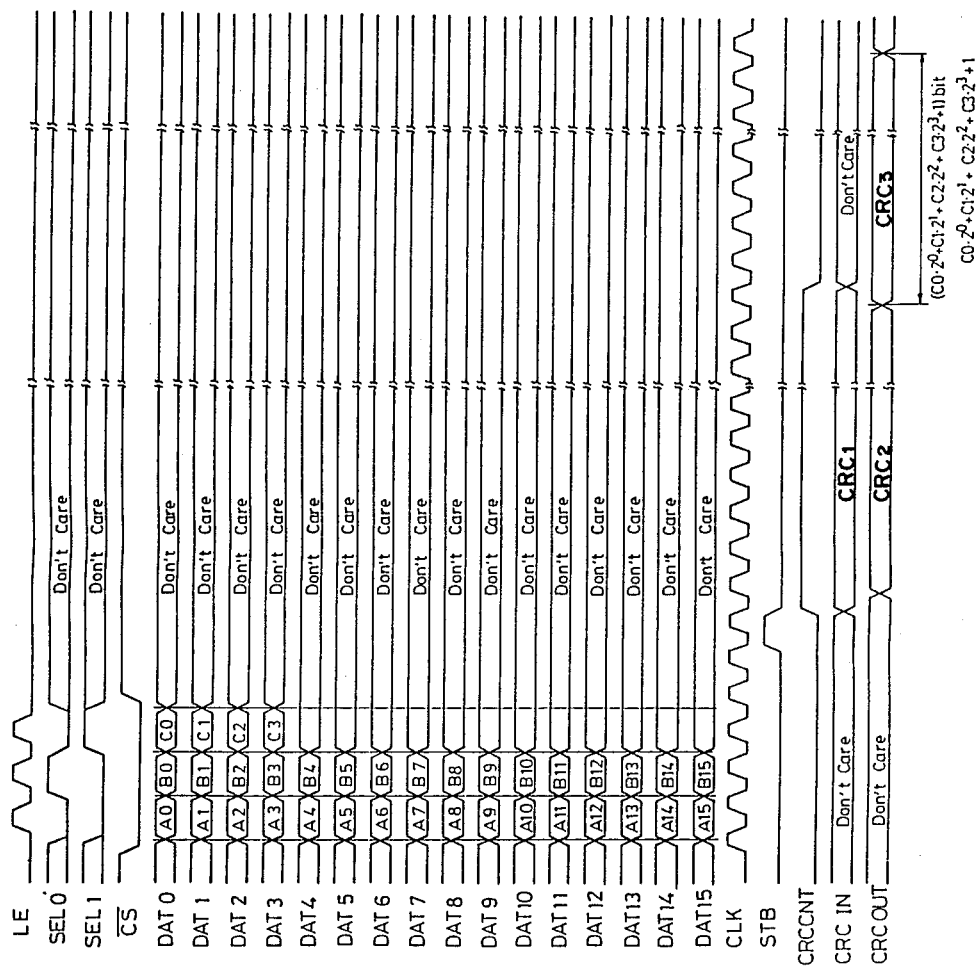
FIG. 4 is a time chart of a CRC operation by the inventive M sequence generator.

Table 2 shows how to establish a generator polynomial of the CRC generator check circuit using the inventive M sequence generator. In this process, an address setting operation of the multiplexer, i.e. selection of a multiplicity of the generator polynomial, is required additionally. For example, in order to establish a generator polynomial $X^8+1$, data is set in latch circuits $L_1$ through $L_3$ as shown in FIG. 3(a). In this case, a circuit which functions as a division circuit becomes equivalent to FIG. 3(b). In this fashion, when a 16-stage modular-type shift register is used, for example, it is possible to establish a generator polynomials other than the multiplicity 16. FIG. 4 shows a time chart of an CRC operation. Comparing it to the prior art system, data establishment for address insruction of the multiplexer MUX 2 is required additionally. As a result, the number of bits of operation surpluses are changed.

Figure 5A:
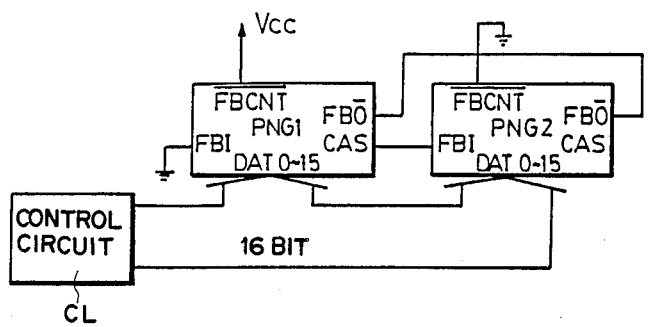
FIG. 5A shows a prior art 24 stage modular-type shift register and FIG. 5B shows an inventive 24 stage modular-type shift register for comparison between both arrangements.

The invention further improves the flexibility in code setting. FIG. 5A shows a code setting example of a CRC generator check circuit using the inventive M sequence generator including a modular-type shift register having 16 stages incorporated into an IC. In FIG. 5, PNG1 and PNG2 denote M sequence generators, CL refers to a control circuit for supplying PNG1 and PNG2 with data DAT.

Figure 5B:
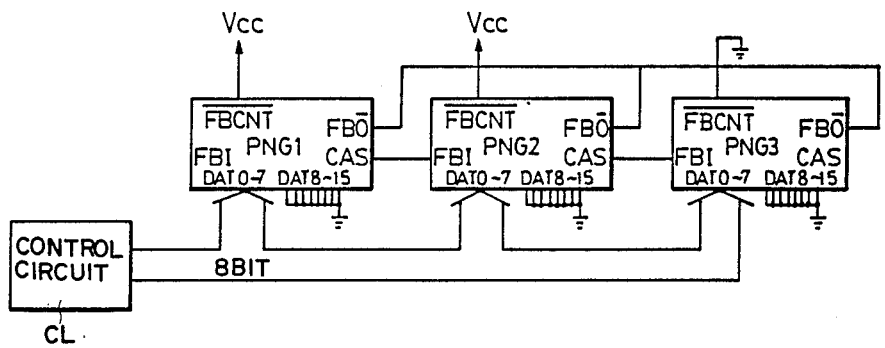

A 24-stage modular-type shift register requires cascade connection of some IC-incorporated M sequence generators. However, since the prior art system is configured to supply PNG1 at the first stage with 16-bit data $DAT_0$ through $DAT_{15}$ from the control circuit CL as shown in FIG. 5(a), all of the 16 stages of the shift register are used. Therefore, control of 16 bits is required in code establishment. In contrast, as shown in FIG. 5(b), the shift registers PNG1 through PNG3 in the inventive system may be configured to use 8 stages in each register. Thus, the control circuit CL need not apply data of more than 8 bits to PNG1 through PNG3, and the number of bits of the control line connecting CL and PNG may be selected according to the number of output bits of the control circuit.

As described above, the invention makes it possible to establish a CRC generator check circuit capable of setting any desired generator polynomial under an external control if the external circuit EX is added. Further, it is possible to use any desired number of stages of modular-type shift registers of M sequence generators in cascade connection to increase flexibilities in code setting and switching.

What is claimed is:

1. An apparatus comprising a maximum length linearly occurring code sequence generator which includes:

a shift register which has a plurality of units in cascade connection, each said unit including an exclusive logical sum gate having first and second inputs and an output, a flip-flop having a data input and a data output, an AND gate having first and second inputs and having an output coupled to said first input of said exclusive logical sum gate, and a steering gate having a first input coupled to said output of said exclusive logic sum gate, having a second input, and having an output coupled to said data input of said flip-flop;

means for applying a respective control signal to said first input of said AND gate of each said unit;

means for applying a respective initial condition signal to said second input of said steering gate of each said unit;

a multiplexer having a plurality of data inputs which are each coupled to said data output of said flip-flop of a respective said unit and having a data output, said multiplexer selecting said output of one of said flip-flops present at a respective one of said data inputs of said multiplexer and supplying it to said data output of said multiplexer; and a selectively actuable three-state buffer having a data input coupled to said data output of said multiplexer and having a data output coupled to said second input of said AND gate of each said unit of said shift register;

wherein said second input of said exclusive logical sum gate of each of said units other than a first of said units is coupled to the data output of the flip-flop of a different said unit.

2. An apparatus as recited in claim 1, further comprising a cyclic redundancy check circuit which includes: a further exclusive logical sum gate for effecting modulo 2 addition of data present at first and second inputs thereof, said first input of said further exclusive logical sum gate being coupled to said data output of said multiplexer of said maximum length linearly occurring code sequence generator, and said second input of said further exclusive logical sum gate having applied thereto a signal representing CRC operated data; a further AND gate having first and second inputs to which are respec-

TABLE 2

| Data Selector | | Data | | | | | | | | |
|---|---|---|---|---|---|---|---|---|---|---|
| SEL 0 | SEL 1 | DAT 0 | DAT 1 | DAT 2 | ... | DATm-1 | DATm | ... | DATn-2 | DATn-1 | |
| 0 | 0 | $A_0$ | $A_1$ | $A_2$ | ... | $A_{m-1}$ | $A_m$ | ... | $A_{n-2}$ | $A_{n-1}$ | $A_1$: initial value of the (i + 1)th step of the shift register. All are "0" in CRC operation. |
| 1 | 0 | $B_0$ | $B_1$ | $B_2$ | ... | $B_{m-1}$ | $B_m$ | ... | $B_{n-1}$ | $B_{n-1}$ | $B_1$: count of a generator polynomial $X^1$. The count of the highest multiplici becomes "1" automatically. |
| 0 | 1 | $C_0$ | $C_1$ | $C_2$ | ... | $C_{m-1}$ | X | ... | X | X | The multiplicity of a generator polynomial is determined. the multinomial is $C_0 2° + C_1 2^1 + C_2 2^2 + \ldots C_{m-1} 2^{m-1}$ |

X: Nothing
m = $\log_2 n$ tively applied an output signal of said further exclusive logical sum gate and a control signal, said further AND gate having an output which is coupled to said output of said three-state buffer, whereby said data output of said multiplexer can carry signals representing a quotient and a residue of the CRC operated data.

3. An apparatus as recited in claim 2, wherein said three-state buffer has a control input to which is supplied a control signal controlling selective actuation of said buffer, said control signal for said buffer disabling said buffer when said control signal for said further AND gate is enabling said further AND gate, and said control signal for said further AND gate disabling said further AND gate when said control signal for said buffer is enabling said buffer.

4. An apparatus as recited in claim 1, wherein said multiplexer has a plurality of select inputs selecting one of said data inputs thereof to be coupled by said multiplexer to its data output, wherein said steering gate of each said unit has a select input selecting one of said first and second inputs thereof to be coupled by the steering gate to its output, and including means for supplying select signals to said select inputs of said multiplexer and a select signal to said select input of each said steering gate.

5. An apparatus as recited in claim 1, wherein said flip-flop of each said unit has a clock input, and including means for supplying a clock signal to said clock input of each of said flip-flops.

6. An apparatus as recited in claim 1, including an input terminal coupled to said second input of said exclusive logical sum gate of said first of said units.

7. An apparatus as recited in claim 1, further comprising a cyclic redundancy check circuit which includes a further exclusive logical sum gate having a first input coupled to said data output of said multiplexer of said maximum length linearly occurring code sequence generator, having a second input coupled to a CRC operated data signal, and having an output; and selectively actuable means for coupling said output of said further exclusive logic sum gate to said output of said buffer of said maximum length linearly occurring code sequence generator.

8. An apparatus comprising: code sequence generator means for generating a maximum length linearly occurring code sequence, said generator means having a plurality of data outputs; a multiplexer having a plurality of data inputs each coupled to a respective one of said data outputs of said generator means, having a data output, and having a plurality of select inputs; a buffer having a data input coupled to said data output of said multiplexer, having a data output coupled to said sequence generator means, and having a control input facilitating selective actuation of said buffer; means for supplying select signals to said select inputs of said multiplexer and a control signal to said control input of said buffer; and first and second output terminals which are respectively coupled to said data input and said data output of said buffer circuit.

9. An apparatus comprising a maximum length linearly occurring code sequence generator which includes: a plurality of flip-flops each having a clock input, a data input, and a data output; means for applying a clock signal to said clock input of each said flip-flop; and gating means responsive to said data output of each said flip-flop for generating a plurality of sequence signals which are each applied to the data input of a respective one of said flip-flops; wherein said gating means including a multiplexer having a plurality of data inputs each coupled to the output of a respective one of said flip-flops, having a data output, and having a plurality of select inputs which select one of said data inputs thereof to be coupled by said multiplexer to said data output thereof, a selectively actuable buffer having a data input coupled to said data output of said multiplexer, having a data output, and having a control input, means for supplying select signals to said select inputs of said multiplexer and a control signal to said control input of said buffer, and first and second output terminals which are respectively coupled to said data input and said data output of said buffer.

* * * * *